United States Patent
Yin et al.

(10) Patent No.: US 8,297,225 B2
(45) Date of Patent: Oct. 30, 2012

(54) CAPACITIVE CVD REACTOR AND METHODS FOR PLASMA CVD PROCESS

(75) Inventors: Gerald Yin, Shanghai (CN); Jinyuan Chen, Shanghai (CN); Tuqiang Ni, Shanghai (CN)

(73) Assignee: Advanced Micro-Fabrication Equipment, Inc. Asia, Georgetown, Grand Cayman (KY)

( * ) Notice: Subject to any disclaimer, the term of this patent is extended or adjusted under 35 U.S.C. 154(b) by 292 days.

(21) Appl. No.: 12/498,295

(22) Filed: Jul. 6, 2009

(65) Prior Publication Data

US 2010/0126667 A1   May 27, 2010

(30) Foreign Application Priority Data

Nov. 26, 2008   (CN) .......................... 2008 1 0203405

(51) Int. Cl.
*C23C 16/54* (2006.01)
*C23F 1/08* (2006.01)
(52) U.S. Cl. ................. 118/723 E; 156/345.43
(58) Field of Classification Search ............. 156/345.43; 118/723 E
See application file for complete search history.

(56) References Cited

U.S. PATENT DOCUMENTS

| | | | |
|---|---|---|---|
| 5,200,232 A | 4/1993 | Tappan et al. | |
| 5,882,424 A | 3/1999 | Taylor et al. | |
| 6,071,573 A | 6/2000 | Koemtzopoulos et al. | |
| 6,207,590 B1 * | 3/2001 | Shan | 438/788 |
| 6,465,366 B1 | 10/2002 | Nemani et al. | |
| 6,974,523 B2 | 12/2005 | Benzing et al. | |
| 7,695,983 B2 * | 4/2010 | Hoffman | 438/5 |
| 2007/0084563 A1 * | 4/2007 | Holland | 156/345.28 |
| 2008/0011424 A1 * | 1/2008 | Yin et al. | 156/345.48 |
| 2008/0251207 A1 * | 10/2008 | Chen et al. | 156/345.48 |
| 2009/0236043 A1 * | 9/2009 | Matsudo et al. | 156/345.43 |
| 2010/0126667 A1 * | 5/2010 | Yin et al. | 156/345.43 |

OTHER PUBLICATIONS

P. Kucher, et al., "Advanced metallization technology for 256M DRAM," Applied Surface Science, vol. 91, Issue 1-4, pp. 359-366, 1995, Elsevier Science B.V.

K. Schade, et al., "Very high frequency plasma CVD of silicon oxide," Surface & Coatings Technology, vol. 200, Issue 1-4, pp. 364-367, 2005, Elsevier B.V.

* cited by examiner

*Primary Examiner* — Sylvia R. MacArthur
(74) *Attorney, Agent, or Firm* — Nixon Peabody LLP; Joseph Bach, Esq.

(57) ABSTRACT

A decoupled capacitive CVD reactor is described, which provides improved CVD capabilities, including processing at lower temperatures, performing alternating deposition and etching steps, and performing in situ cleaning of the chamber, without the need for a remote plasma source. Two RF frequencies are coupled to the susceptor, while the anode is grounded. The high frequency RF source is operated so as to control the plasma density, while the low frequency RF source is operated to control species bombardment on the substrate, so as to control the properties of the film being deposited. Additionally, both RF sources may be controlled, together with selection of gasses supplied to the chamber, to operate the chamber either in deposition mode, partial etch mode, etching mode, or cleaning mode.

14 Claims, 4 Drawing Sheets

CAPACITIVE CVD REACTOR AND METHODS FOR PLASMA CVD PROCESS

RELATED APPLICATIONS

This application claims priority from Chinese Patent Application Serial No. 200810203405.X, which was filed on Nov. 26, 2008, the entire disclosure of which is incorporated herein by reference.

BACKGROUND

1. Filed of the Invention

This invention relates to the art of substrate micro-fabrication and, more particularly, to plasma assisted chemical vapor deposition chamber and processes.

2. Related Arts

Micro-fabrication of substrates is a well know art employed in, for example, fabrication of semiconductors, flat panel displays, light emitting diodes (LED's), solar cells, etc. various steps in micro-fabrication include forming thin film using various chemical vapor deposition (CVD) techniques. One such technique is generally referred to as plasma assisted vapor deposition (PECVD). Various chamber technologies have been used for PECVD fabrication, including microwave, inductive, and capacitive sources. In general, conventional chambers are designed so that power is delivered to the plasma from a source that is remote or opposite the substrate. For example, in inductive sources the coil is positioned above the roof of the chamber, while in capacitive sources the RF energy is generally applied to the anode embedded in the showerhead or ceiling of the reactor. The reasoning behind such design relates to preventing species bombardment of the substrate during deposition of the thin film.

Another feature of the prior art chambers is the use of remote clean. Since the chambers are used to deposit various materials on the substrate, the materials are also deposited on various parts of the chamber. One problem is that once the deposits on the chamber parts reach a certain thickness level, and partly as a result of thermal cycling of the chamber, the coating flakes off and generates particles that land on the substrate, thereby causing defects. Therefore, it is desirable to clean the chamber from such deposits. One method for cleaning the chamber is the use of plasma etching of the deposits. The most utilized method in the art is that of a remote plasma source, such as Astron®, available from MKS Instruments of Andover, Mass., Litmass® or available from Advanced Energy of Fort Collins, Colo. However, this solution requires attaching additional hardware to the reactor and activation of a plasma source separate from the reactor's source.

A recent problem encountered in the CVD art is that of "pinching." Due to aspect ration of various structures that need to be CVD filled, as the material is deposited on the sides of the trench it closes the top so as to form voids inside the trench. This is shown in FIG. 1, illustrating trench 110 etched in substrate 100. As shown by contour lines 102, 104, and 106, as material is CVD deposited onto the substrate, it pinches at the top, 108, so as to form a seam or void 120. Even when a seam is generated, after an annealing step it often expands into a void. Such a void is undesirable as is considered a defect.

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

A decoupled capacitive, i.e., parallel plate, CVD reactor is described, which provides improved CVD capabilities, including processing at lower temperatures, performing alternating deposition and etching steps, and performing in situ cleaning of the chamber, without the need for a remote plasma source.

According to certain aspects of the invention, Two RF frequencies are coupled to the susceptor, while the anode is grounded. This structure provides a high density plasma chamber with separate control and efficient tuning of plasma density and species energy. The high frequency RF source is operated so as to control the plasma density, while the low frequency RF source is operated to control species bombardment on the substrate, so as to control the properties of the film being deposited. Additionally, both RF sources may be controlled, together with selection of gasses supplied to the chamber, to operate the chamber either in deposition mode, partial etch mode, etching mode, or cleaning mode. In general, the low frequency RF source is set at a lower power than the high frequency RF source.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

Embodiments of the invention provide a plasma processing apparatus that is operable in four modes: CVD, partial etch, etch, and clean modes. In CVD mode the chamber is operated to deposit layers on the substrate. In partial etch mode deposition processing is performed concurrently with partial etch process so as to control the properties of the deposited layer. In etch mode deposition is stopped and the deposited layer is at least partially etched. In clean mode in-situ plasma is used to efficiently clean the chamber. The following are some examples of embodiments of the inventive chamber.

Figure 1:
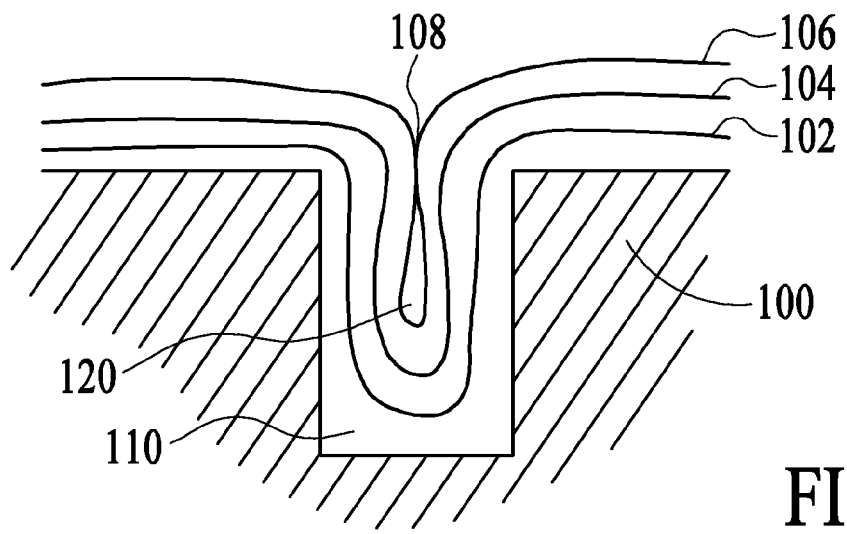
FIG. 1 illustrates a cross section of a CVD fill of a trench, according to the prior art.
Figure 2:
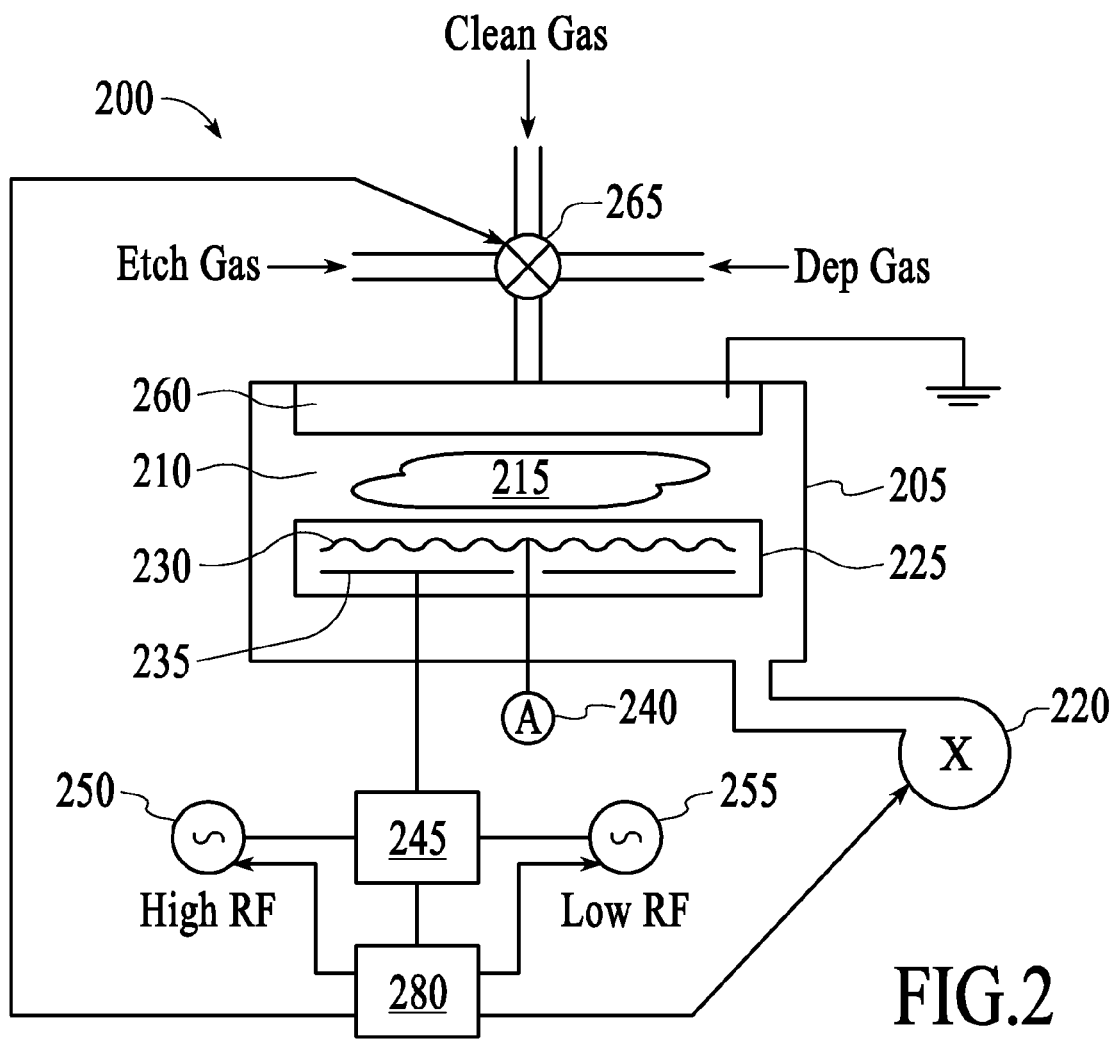
FIG. 2 illustrates a cross section of a CVD chamber according to an embodiment of the invention.

FIG. 2 illustrates a cross section of an embodiment of a decoupled capacitive plasma CVD reactor 200 according to an embodiment of the invention. The reactor 200 has a chamber body 205 having a susceptor 225 situated therein and a showerhead 260 opposing the susceptor and also serving as a grounded anode. A gap 210 is formed between the susceptor 225 and the showerhead 260, where plasma 215 may be ignited and maintained. The pressure inside the chamber is controlled with pump 220. Due to the design of this chamber, there is no need for a turbo-molecular pump. Rather, a simple mechanical pump may suffice, as the processes in the chamber may be performed at pressures in the range of 50 mTorr to 10 Torr, so as to enable CVD, etch, and clean processes.

It should be appreciated that rather than using a showerhead, element 260 may function as a grounded anode only, while gas is delivered using injectors, e.g., from the sidewalls of the chamber 205. Gas is delivered from gas controller 265, which may be an array of "gas sticks" in a manner well known in the art, where each gas stick may include filters, mass flow controllers (MFC's), valves, etc. The controller 265 can be operated to selectively deliver deposition precursor gases, etching precursor gases, and/or cleaning precursor gases. The cleaning gas may or may not be the same as the etching gas.

The susceptor includes a heater 230, which is powered by source 240. The heater 230 is operable to maintain the substrate at temperatures in the range of about 100° C.-500° C. The susceptor also includes a cathode 235, which is power by two RF power sources, high frequency 250 and low frequency 255, fed via frequency match 245. High frequency source 250 provides RF frequency which may be, e.g., 27 MHz, 60 MHz, 100 MHz, or higher. In general, the high frequency should be 27 MHz or higher. The low frequency may be in the range of hundreds of kilohertz up to 13.56 MHz. For example, it may be set to 400 MHz, 2 MHz, 2.2 MHz, or 13.56 MHz. Applying the RF frequency to the bottom electrode rather than to the top electrode (as is done in the prior art) provides at least the following benefits. Coupling the RF to the bottom electrode enables control of the deposition rate compared to the etch rate, i.e., applying RF power to cause deposition rate to be higher than etch rate. Also, the application of RF power to the bottom electrode enables better dissociation of deposition precursor gas. Also, applying the RF power to the top electrode, as is done in the prior art, causes the plasma to attack the chamber's ceiling, thereby causing particles. On the other hand, when the RF is applied to the bottom electrode, the plasma does not attack the ceiling of the chamber.

Reactor 200 may be operated in a CVD mode to perform, e.g., gap fill process. Gap fill is traditionally done using a high density plasma CVD, HDP-CVD, which utilizes an inductive RF source. However, reactor 200 may perform gap fill by operating the reactor as follows. The pump 220 is operated to maintain a pressure of 1 to 10 Torr in the chamber. A deposition gas which may include silicon-containing gas, an oxygen-containing gas, and a fluent gas, e.g., monosilane ($SiH_4$), molecular oxygen ($O_2$) and helium, or Silane and Ozone, is provided by the gas controller 265 via showerhead 260. The heater 230 is energized to maintain the substrate at, e.g., 200° C.-400° C. The high frequency source 150 is energized to about 200 W-1000 W, while the bias, i.e., low frequency RF generator 255 is energized to 0-500 W. Notably, as the energy of the bias generator 255 is increased, the reactor 200 is transformed to operate in a partial etch mode. Optionally, argon gas may be added while the reactor 200 operates in a partial etch mode. The argon species can be used to vary the density and/or planarity/conformity of the deposited film.

The reactor 200 may also be operated in an etch mode by having controller 280 set operating parameters of the chamber to enable etching. The controller may change the operation modes of, e.g., the pump 220, the RF generators 250, 255, and the gas controllers. To perform etch, the pump 220 is operated to maintain the chamber at about 50 mT to 2 T. Gas controller 265 is operated to stop injection of deposition gas and instead inject etch precursor gas, e.g., fluorocarbon chemistry with or without argon gas. Also, the RF generators may be operated at different power settings. For example, since the low RF frequency controls the ion bombardments, the power of the RF generator 255 may be increased to cause more ion bombardment of the substrate, thereby increasing ion etch. Notably, the etch mode may be interlaced with deposition mode so as to control the surface texture, planarity and/or conformity of the deposited layer.

Figure 3:
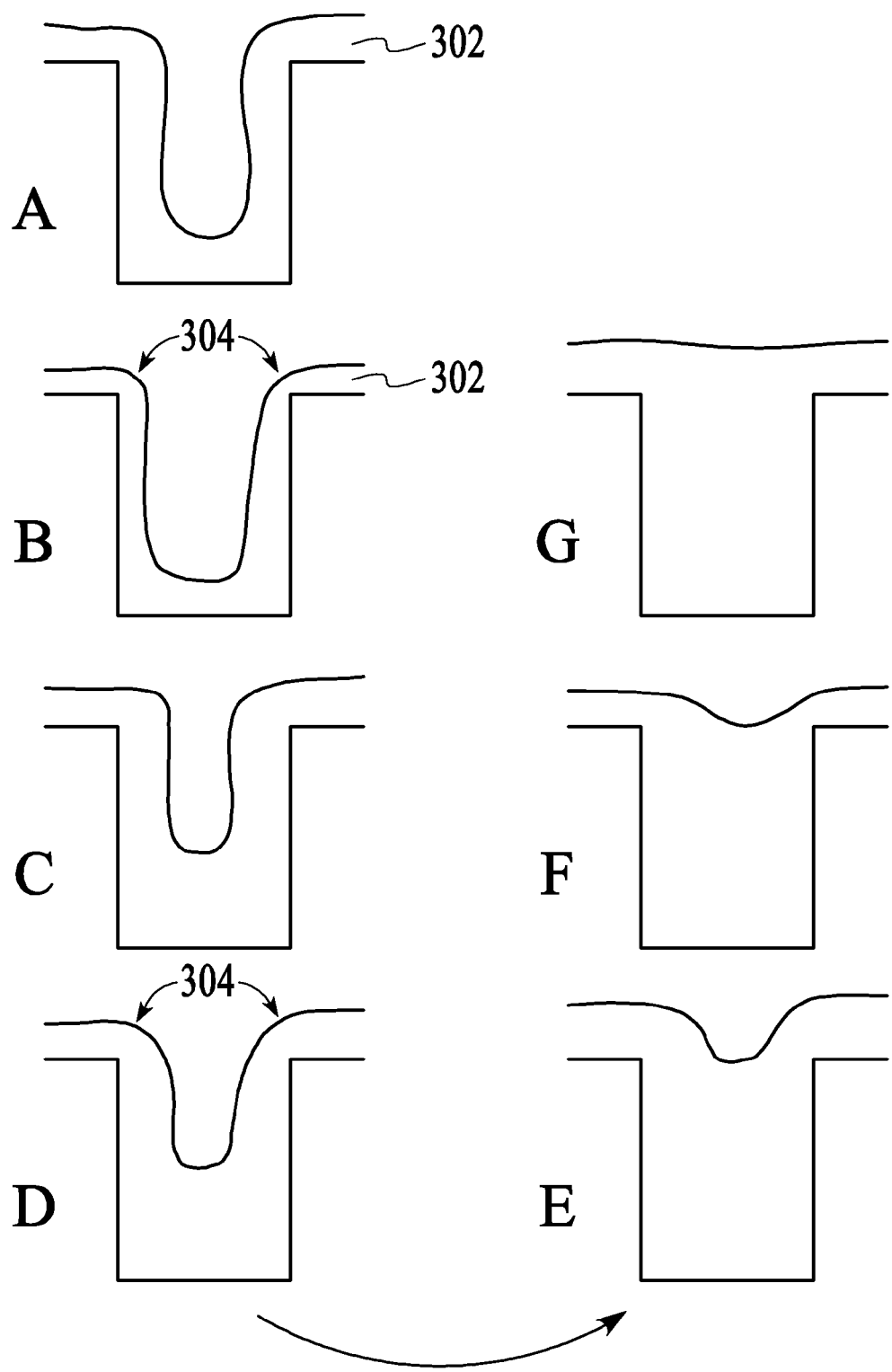
FIGS. 3A-3G illustrate a process for gap fill using the reactor 200 in an alternating CVD—etch modes.

FIGS. 3A-3G illustrate a process for gap fill using the reactor 200 in an alternating CVD—etch modes. In FIG. 3A a first layer 302 is deposited by operating the reactor 200 in a CVD mode. Then, the reactor 200 is operated in an etch mode so as to partially etch layer 302. As shown in FIG. 3B, the layer naturally tends to etch preferentially at the corners 304, so as to widen the opening to the gap. A further deposition step then follows to further fill the gap, as shown in FIG. 3C. As the corners 304 become close again, the reactor is reverted to etch mode, so as to partially etch the deposited layer and open the corners 304, as shown in FIG. 3D. As shown in FIG. 3E, the gap is almost totally filled, at which time the reactor is reverted to etch so as to planarize the top of the deposited layer, as shown in FIG. 3F. Further deposition and etch processes can be used to provide a planar surface, as shown in FIG. 3G.

In an alternative embodiment, partial etch is continuously performed together with the CVD, so that the corners 304 are continuously bombarded and etched. For this process, the reactor is operated in partial etch mode, wherein the controller sets the chamber's operating parameters such that deposition gas is supplied to the chamber and the heater is energized to deposition temperature. The high frequency source is energized to generate plasma at density controlled for deposition, while the bias power is slightly energized, e.g., 100-300 W to generate low level bombardment of the substrate. Optionally, argon gas is added to the deposition gas to enhance sputtering of the substrate so as to physically etch the corners 304.

Once processing is completed, the substrate may be removed and the chamber may be operated in a cleaning mode by having the controller set various operating parameters to perform in-situ chamber cleaning. For example, during cleaning mode the chamber is operated by energizing the high RF source to generate plasma using cleaning gas, such as, e.g., HF, F2, C2F6, COF2, etc. During cleaning mode, the low frequency bias generator 255 may be kept off, or energized to a low level, so as to minimize ion bombardment of the interior parts of the chamber. On the other hand, the pump 220 may be energized to reduce the pressure in the chamber to below 1 T.

Figure 4:
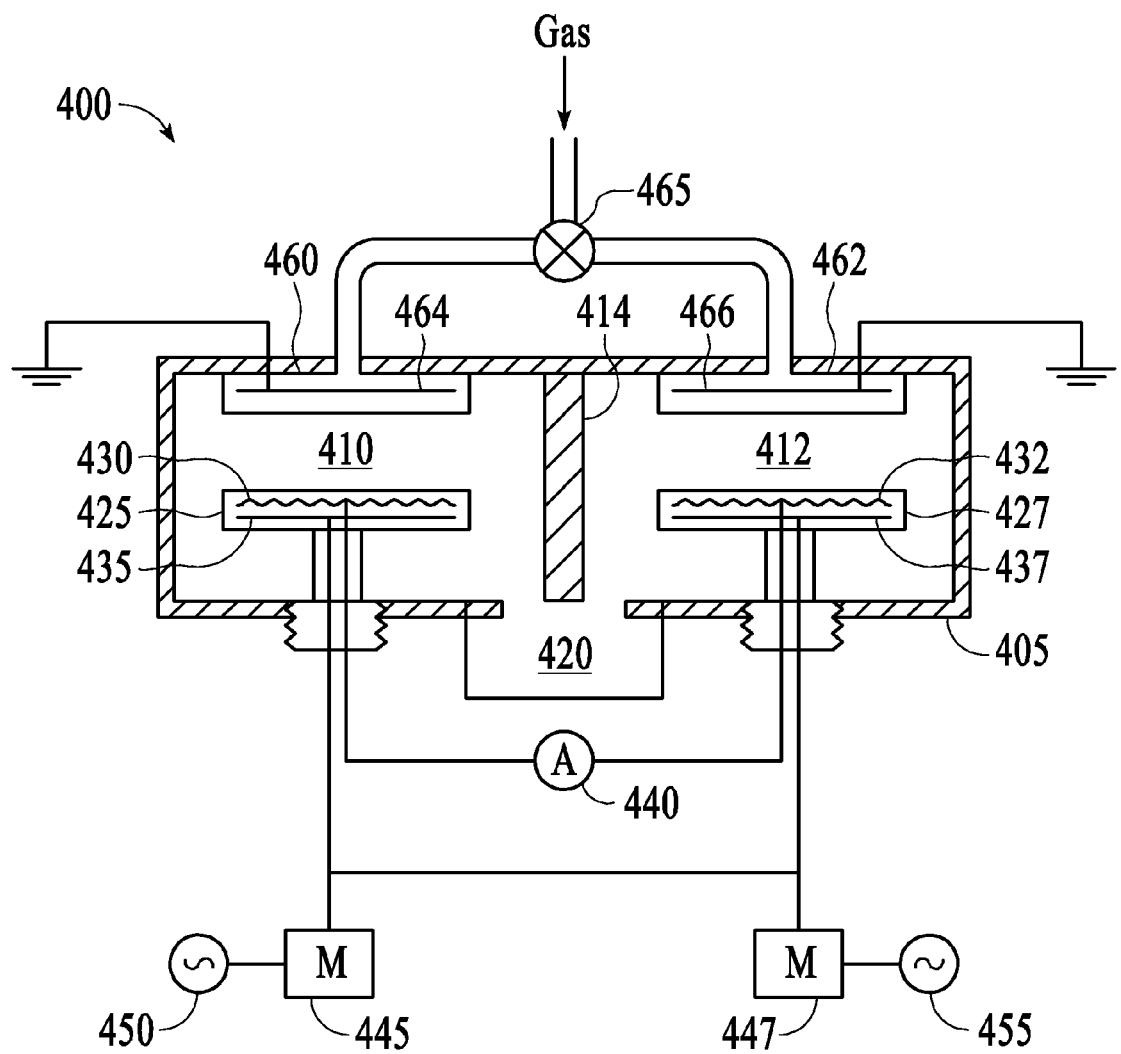
FIG. 4 illustrates another embodiment of the invention, wherein two substrates may be processed simultaneously.

FIG. 4 illustrates another embodiment of the invention, wherein the chamber body 405 is divided into two processing zones 410, 412, by partition 414. The two zones 410, 412 are fluidly coupled to pump 420. Each zone has a susceptor 425, 427 and showerhead 460, 462. Each susceptor includes a heater, 430, 432 and an electrode 435, 437. The electrodes 435, 437 are coupled to high RF source 450 and its related impedance match 445, and to low RF bias 455 and its related impedance match 447. Each showerhead is coupled to gas source controller 465 and includes an electrode 464, 466 that is grounded. Each zone can be operated in CVD mode, partial etch mode, etch mode, and clean mode, similar to the modes described above.

As can be understood from the above description, using the parallel plate structure with dual frequency fed from the susceptor creates a planar plasma source that can be easily extended to any required area, while maintaining relatively uniform plasma distribution. Therefore, this structure can be easily extended to large substrate sizes, so as to fabricate, for example, LCD displays and thin-film solar panels. Also, this structure can operate at pressure regimes, e.g., 2-5 Torr range, that do not require turbo molecular pumps, but can be maintained using a simple mechanical pump, thereby lowering costs and complexity.

Another thing to note is that for the reactor described herein there is no need for an electrostatic (ESC) chuck. Rather, a simply susceptor may be used. On the other hand, the susceptor should be operable at high temperature, higher than conventional ESC chuck. The level of temperature of the chuck would depend on the frequency of the high frequency plasma source. The temperature requirements of the susceptor can be relaxed as the frequency of the source is increased. For example, the temperature of the susceptor may be reduced if the source is at 100 MHz or above, as opposed to when the source operates at, say 27 MHZ.

Figure 5:
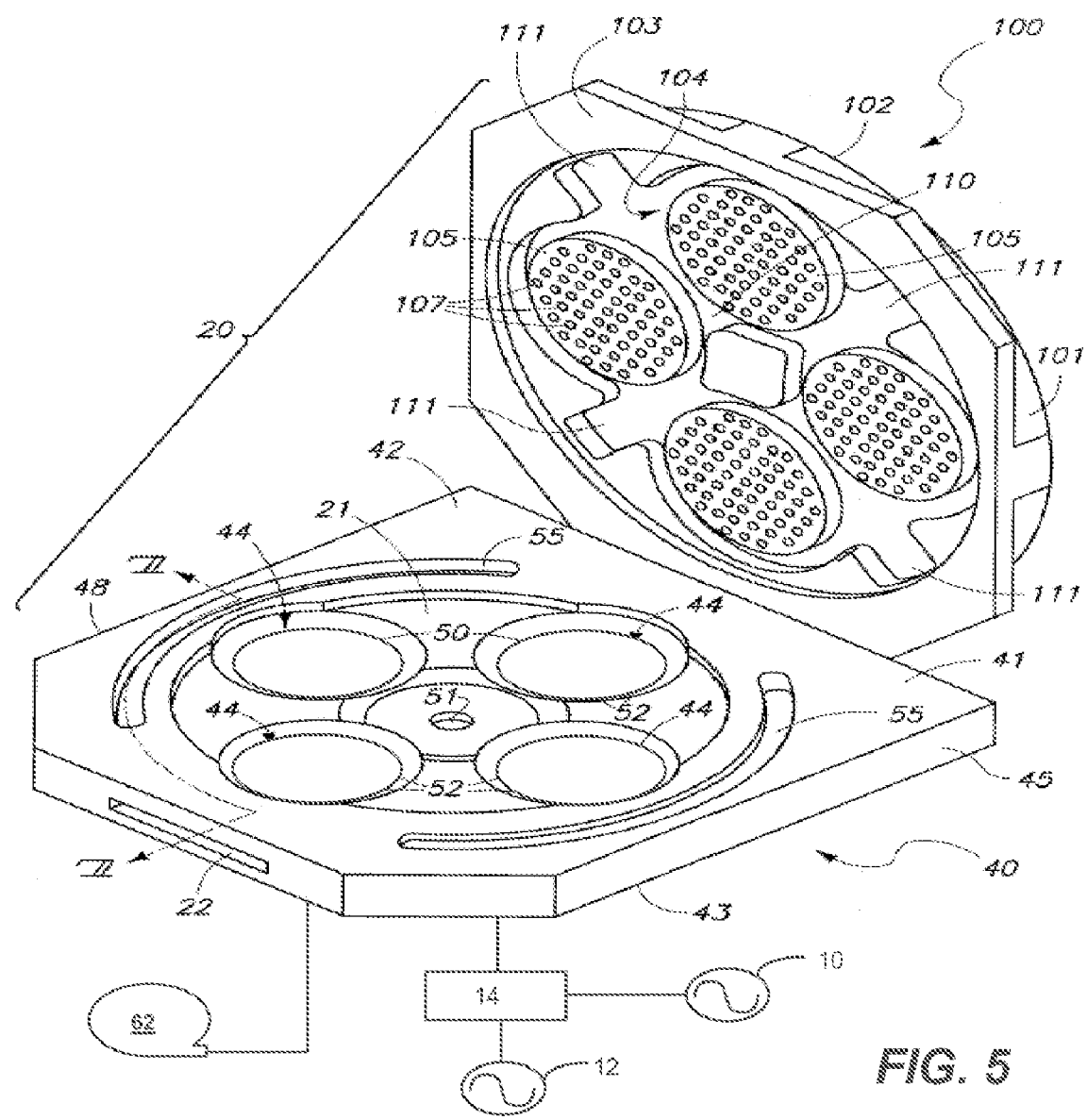
FIG. 5 illustrates yet another embodiment of the invention, wherein four substrates may be processed simultaneously.

FIG. 5 illustrates yet another embodiment of the invention, wherein four substrates may be processed simultaneously. Reactor 40 has chamber body 45 and lid 100. The lid has four showerheads 105, which also serve as anodes coupled to ground. When the lid 100 is closed over the body 45, four processing zones, each having a susceptor 44, are created for processing four substrates simultaneously. Each susceptor also includes a cathode embedded therein. Each cathode is coupled to a high frequency RF generator 10 and low frequency RF generator 12, via match 14. A mechanical pump 62 is provided to control the pressure in the four processing zones, via evacuation slits 55. The substrates are delivered and removed from the chamber via valve 22. At central coupling 51 a rotary robot arm is situated (not shown as not to obscure other elements) which is used to accept substrates from valve 22 and place the substrates in the respective processing zone.

It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein. The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. Various aspects and/or components of the described embodiments may be used singly or in any combination in the server arts. It is intended that the specification and examples be considered as exemplary only, with a true scope and spirit of the invention being indicated by the following claims.

The invention claimed is:

1. A capacitively coupled switchable reactor operable in plasma chemical vapor deposition (CVD) mode and etch mode to process a substrate, comprising:
    a chamber body;
    an anode situated at the ceiling of the chamber body, the anode being coupled to ground;
    a gas injection apparatus coupled to a deposition gas source for selectively injecting deposition gas, etching gas, or a mixture of deposition gas and etching gas into the chamber;
    a susceptor situated within the chamber body;
    a heater situated within the susceptor;
    an electrode situated within the susceptor;
    a high frequency RF generator coupled to the electrode;
    a low frequency RF generator coupled to the electrode; and,
    a controller operable to switch the operational parameters of the gas injection apparatus, the high frequency RF generator and the low frequency RF generator so as to selectively operate the chamber in one of CVD mode, etch mode, and a combined CVD and etch mode.

2. The reactor of claim 1, wherein the controller operates the heater so as to maintain the substrate at a temperature of 100° C.-500° C.

3. The reactor of claim 1, further comprising a mechanical pump and wherein the controller operates the mechanical pump to maintain the pressure within the reactor to be at 50 mTorr to 10 Torr.

4. The reactor of claim 1, wherein the low frequency RF generator provides RF energy of less than 27 MHz to the electrode.

5. The reactor of claim 4, wherein the high frequency RF generator provides RF energy at 27 MHz or higher to the electrode.

6. The reactor of claim 1, wherein the gas injection apparatus is further coupled to a cleaning gas source for performing in-situ reactor cleaning process.

7. The reator of claim 1, wherein the gas injection apparatus is operable to alternatingly inject deposition gas and etching gas so as to perform alternating CVD and etch steps.

8. The reactor of claim 7, wherein the controller increases the power of the low RF frequency generator during the etch step.

9. The reactor of claim 8, further comprising a mechanical pump and wherein the controller increases the pumping power of the mechanical pump during the etch step.

10. The reactor of claim 7, wherein the controller reduces the temperature of the substrate during the etch step.

11. A capacitively coupled plasma chemical vapor deposition (CVD) reactor operable in deposition mode and in-situ cleaning mode, comprising:
    a chamber body;
    an anode situated at the ceiling of the chamber body, the anode being coupled to ground;
    a gas injection apparatus coupled to a deposition gas source and to a cleaning gas source, for selectively injecting deposition gas and cleaning gas into the chamber in deposition mode and in-situ cleaning mode, respectively;
    a susceptor situated within the chamber body;
    a heater situated within the susceptor;
    an electrode situated within the susceptor;
    a high frequency RF generator coupled to the electrode; and,
    a low frequency RF generator coupled to the electrode.

12. The reactor of claim 11, the high frequency RF generator operates at frequency of 27 MHz or higher and the low frequency RF generator operates at frequency of 13.56 MHz or lower.

13. The reactor of claim 12, further comprising energy source coupled to the heater to maintain the heater at temperature in the range of 100° C.-500° C.

14. The reactor of claim 13, further comprising a mechanical pump operable to control the pressure within the reactor to be at 50 mTorr to 10 Torr.

* * * * *